(12) United States Patent
Shin et al.

(10) Patent No.: US 6,992,361 B2
(45) Date of Patent: Jan. 31, 2006

(54) DEEP WELL IMPLANT STRUCTURE PROVIDING LATCH-UP RESISTANT CMOS SEMICONDUCTOR PRODUCT

(75) Inventors: Jiaw-Ren Shin, Hsin-Chu (TW); Jian-Hsing Lee, Hsin-Chu (TW); Shui-Hung Chen, Hsin-Chu (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 10/761,658

(22) Filed: Jan. 20, 2004

(65) Prior Publication Data

US 2005/0158938 A1    Jul. 21, 2005

(51) Int. Cl.
*H01L 29/00* (2006.01)

(52) U.S. Cl. ............... 257/499; 257/509; 438/199

(58) Field of Classification Search ............... 438/199, 438/200, 230, 232, 275, 303, 304, 305, 306, 438/307, 595; 257/499, 504, 509
See application file for complete search history.

(56) References Cited

U.S. PATENT DOCUMENTS

| | | | |
|---|---|---|---|
| 4,683,488 A | 7/1987 | Lee et al. | |
| 4,947,227 A | 8/1990 | Teng | |
| 5,976,922 A * | 11/1999 | Tung | 438/228 |
| 6,157,070 A | 12/2000 | Lin et al. | |
| 6,329,233 B1 * | 12/2001 | Pan et al. | 438/199 |
| 6,359,316 B1 | 3/2002 | Voss et al. | |

\* cited by examiner

*Primary Examiner*—Phuc T. Dang
(74) *Attorney, Agent, or Firm*—Tung & Associates

(57) ABSTRACT

A CMOS semiconductor product employs a first doped well of a first polarity and a second doped well of a second polarity opposite the first polarity, each formed laterally separated within a semiconductor substrate. The first doped well is further embedded within a third doped well of the second polarity that further separates the first doped well from the second doped well. The third doped well provides latch-up resistance for a pair of MOS transistors formed within the first doped well and the second doped well.

20 Claims, 2 Drawing Sheets

DEEP WELL IMPLANT STRUCTURE PROVIDING LATCH-UP RESISTANT CMOS SEMICONDUCTOR PRODUCT

BACKGROUND OF THE INVENTION

1. Field of the Invention

The invention relates generally to CMOS semiconductor products. More particularly, the invention relates to latch-up resistant CMOS semiconductor products.

2. Description of the Related Art

Semiconductor products are fabricated employing transistors as switching elements within circuits typically directed to either data storage applications or data manipulation applications. Particularly common semiconductor products are complementary metal oxide semiconductor (CMOS) semiconductor products. CMOS products employ alternating arrays of n-channel metal oxide semiconductor (MOS) transistors and p-channel metal oxide semiconductor (MOS) transistors. CMOS semiconductor products are generally desirable since they are easy to fabricate and they operate efficiently.

Although CMOS semiconductor products are quite common, they are nonetheless not entirely without problems. In particular, due to the presence of complementary polarities of MOS transistors, CMOS semiconductor products are often susceptible to latch-up. Latch-up is a phenomenon where various doped components within opposite polarity MOS transistors electrically connect to form undesirable parasitic devices, such as parasitic transistors. Latch-up effects become pronounced as CMOS semiconductor product dimensions decrease. They often provide electrical current flows that may physically damage CMOS semiconductor products.

Desirable are latch-up resistant CMOS semiconductor products that may be readily fabricated.

The invention is directed towards the foregoing object.

SUMMARY OF THE INVENTION

A first object of the invention is to provide a CMOS semiconductor product.

A second object of the invention is to provide a CMOS semiconductor product in accord with the first object of the invention, where the CMOS semiconductor product is resistant to latch-up.

In accord with the objects of the invention, the invention provides a CMOS semiconductor product and a method for operating the CMOS semiconductor product.

The CMOS semiconductor product comprises a semiconductor substrate. A first doped well of a first polarity and a laterally separated second doped well of a second polarity opposite the first polarity are both formed into the semiconductor substrate. A third doped well of the second polarity is formed laterally and vertically surrounding the first doped well of the first polarity. Finally, a MOS transistor of the second polarity is formed within and upon the first doped well and a MOS transistor of the first polarity is formed within and upon the second doped well.

The invention provides a latch-up resistant CMOS semiconductor product that may be readily fabricated.

The invention realizes the foregoing object by employing a third doped well of a second polarity laterally and vertically surrounding a first doped well of a first polarity within a semiconductor substrate. A second doped well of the second polarity is also formed within the semiconductor substrate and laterally separated from the first doped well of the first polarity. A MOS transistor of the first polarity is formed within the second doped well and a MOS transistor of the second polarity is formed within the first doped well. Under typical operating conditions for the CMOS semiconductor product, the third doped well reduces a susceptibility to a snap-back phenomenon when operating the CMOS semiconductor product. Thus, latch-up susceptibility is also reduced within the CMOS semiconductor product.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a CMOS semiconductor product that may be readily fabricated with reduced susceptibility to latch-up.

The invention realizes the foregoing object by employing a third doped well of a second polarity laterally and vertically surrounding a first doped well of a first polarity within a semiconductor substrate. A second doped well of the second polarity is also formed within the semiconductor substrate and laterally separated from the first doped well of the first polarity. A MOS transistor of the first polarity is formed within the second doped well and a MOS transistor of the second polarity is formed within the first doped well. Under typical operating conditions for the CMOS semiconductor product, the third doped well reduces susceptibility to a snap-back phenomenon when operating the CMOS semiconductor product. Thus, latch-up susceptibility is also reduced within the CMOS semiconductor product.

The preferred embodiment illustrates the invention within the context of a CMOS product fabricated employing a p polarity substrate having formed therein a p well laterally separated from an n well, and where the p well is further embedded within a deeper n well that laterally and vertically further isolates the p well from the n well. However, the invention is not intended to be so limited. Rather the invention may be practiced with a semiconductor substrate of either p polarity or n polarity. The invention may also be practiced employing an alternate complementary configuration of an n well embedded within a deeper p well such as to provide a CMOS semiconductor product with latch-up resistance.

FIG. 1 to FIG. 5 show a series of schematic cross-sectional diagrams illustrating the results of progressive stages in fabricating a CMOS semiconductor product in accord with the invention.

Figure 1:
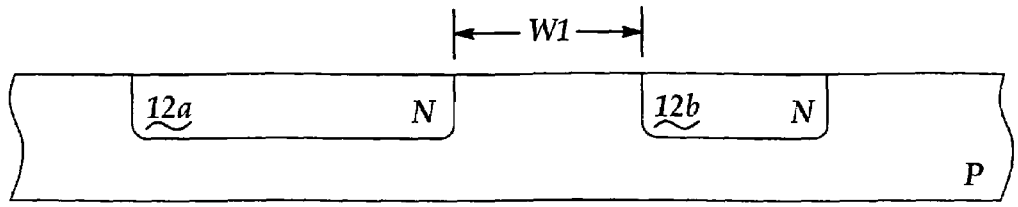
FIG. 1, FIG. 2, FIG. 3, FIG. 4 and FIG. 5 show a series of schematic cross-sectional diagrams illustrating the results of progressive stages in fabricating a CMOS semiconductor product in accord with a preferred embodiment of the invention.

FIG. 1 shows a semiconductor substrate 10. A pair of initial doped wells 12a and 12b is formed laterally separated within the semiconductor substrate 10. The pair of initial doped wells 12a and 12b may be laterally (i.e., horizontally) separated by a separation distance W1 of much less than about 15 microns and preferably in a range of from about 5 to about 10 microns. The semiconductor substrate 10 is preferably a p polarity semiconductor substrate, but as disclosed above an n polarity semiconductor substrate may also be employed. Each of the pair of initial doped wells 12a and 12b is preferably an n doped well. The semiconductor substrate 10 preferably has a p dopant concentration of from about 1E8 to about 1E10 dopant atoms per cubic centimeter. Each of the initial doped wells 12a and 12b preferably has an n dopant concentration of from about 1E11 to about 1E12 dopant atoms per cubic centimeter. The initial doped well 12b is intended to correspond with a second doped well in accord with the invention as broadly claimed.

Figure 2:
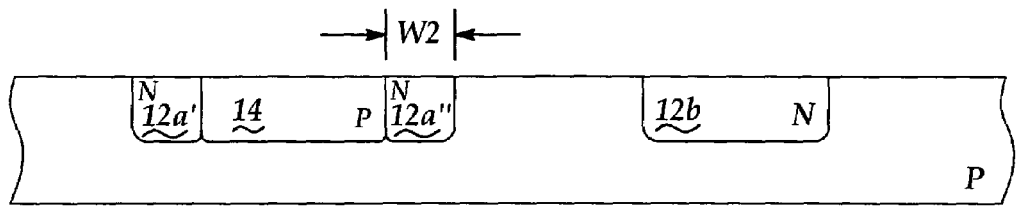

FIG. 2 shows the results of forming an additional doped well 14 within the initial doped well 12a, thus providing a pair of separated initial doped wells 12a' and 12a" adjoining but not beneath the additional doped well 14. Each of the separated initial doped wells 12a' and 12a" has a linewidth W2 of from about 0.5 to about 1.0 microns. The additional doped well 14 is formed of a p polarity opposite the n polarity of the initial doped wells 12a and 12b, and of the same p polarity as the substrate 10. The additional doped well 14 is formed of a p dopant concentration from about 1E13 to about 1E14. The additional doped well 14 is intended to correspond with a first doped well in accord with the invention as broadly claimed. The separated initial doped well 12a", which still has an n dopant concentration of from about 1E11 to about 1E12 dopant atoms per cubic centimeter, is intended to correspond with a fourth doped well in accord with the invention as broadly claimed.

Figure 3:
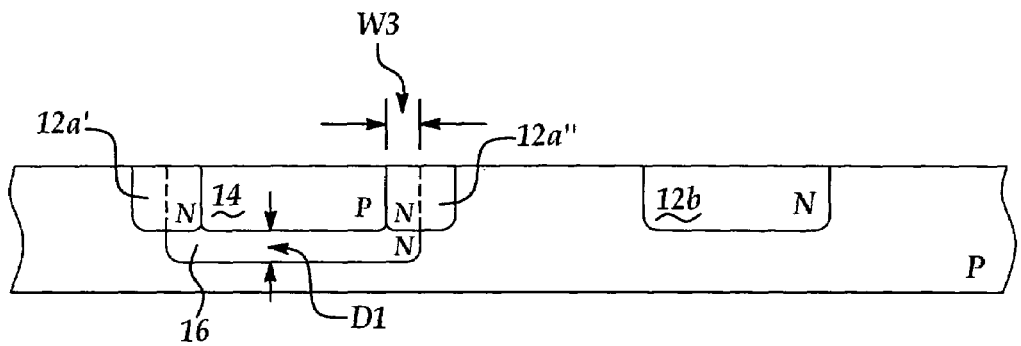

FIG. 3 shows a further additional doped well 16 formed such that the additional doped well 14 is embedded into the further additional doped well 16 while being laterally (i.e., horizontally) and vertically surrounded by the further additional doped well 16. The further additional doped well 16 thus completely isolates the additional doped well 14 from the initial doped well 12b. The further additional doped well 16 is formed to a depth D1 beneath additional doped well 14 of from about 1000 to about 10000 angstroms and a linewidth W3 adjoining the further doped well 14 of from about 0.2 to about 0.5 microns. The further additional doped well 16 is of n polarity. The further additional doped well 16 is formed with a dopant concentration of from about 1E11 to about 1E12 dopant atoms per cubic centimeter, as is the pair of initial doped wells 12a and 12b. The further additional doped well 16 is intended to correspond with a third doped well in accord with the invention as broadly claimed.

Figure 4:
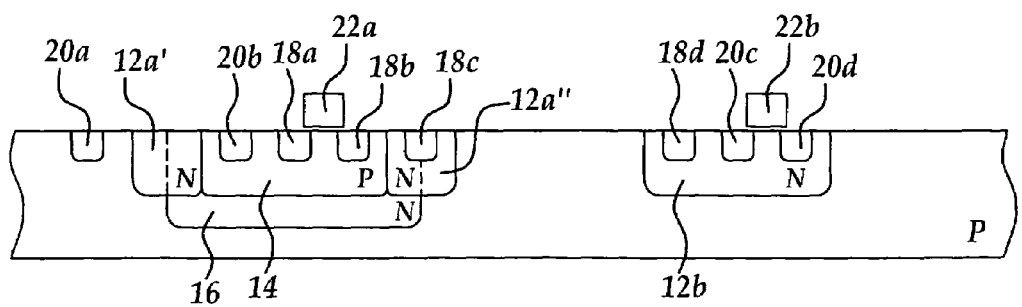

FIG. 4 shows a series of first doped connections 18a, 18b, 18c and 18d within the additional doped well 14, the separated intital doped well 12a" and the initial doped well 12b. The first doped connections 18a, 18b, 18c and 18d are of n polarity. The first doped connections 18a and 18b are intended as source/drain regions. The first doped connections 18c and 18d are intended as ohmic connections to the n well regions into which they are formed. FIG. 4 also shows a series of second doped connections 20a, 20b, 20c and 20d. The series of second doped connections 20a, 20b, 20c and 20d is formed of p polarity. The second doped connections 20a and 20b are intended as ohmic connections within the p substrate 10 or p additional doped well 14 within which they are formed. The second doped connections 20c and 20d are intended as source/drain regions. Each of the series of first doped connections 18a, 18b, 18c and 18d and the series of second doped connections 20a, 20b, 20c and 20d is formed of a dopant concentration from about 1E18 to about 1E20 dopant atoms per cubic centimeter.

Finally, FIG. 4 also shows a pair of gate electrodes 22a and 22b. Corresponding gate dielectric layers are omitted for clarity. The pair of first doped connections 18a and 18b of n polarity form an n MOS transistor in conjunction with the gate electrode 22a. The pair of second doped connections 20a and 20b of p polarity form a p MOS transistor in conjunction with the gate electrode 22b. The n MOS transistor and the p MOS transistor provide a CMOS semiconductor product fabricated within the semiconductor substrate 10.

Figure 5:
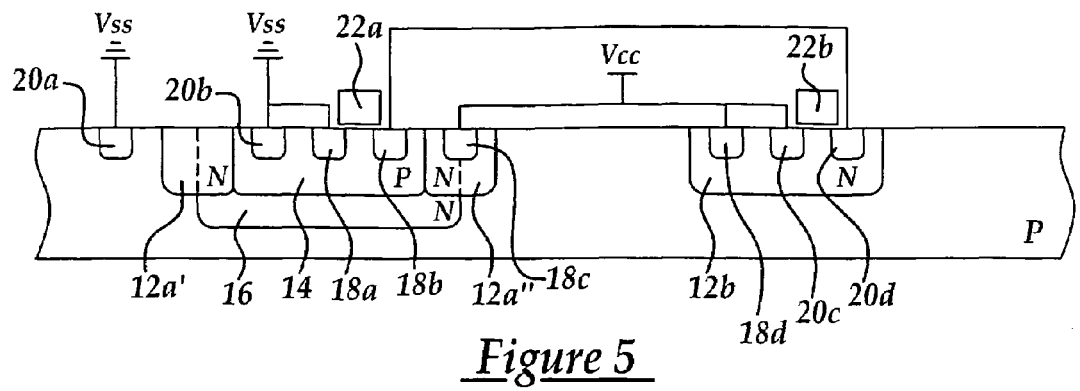

FIG. 5 shows various connections and interconnections to the doped connections 18a, 18b, 18c, 18d, 20a, 20b, 20c and 20d within the CMOS semiconductor product of FIG. 4. The doped connections 20a and 20b, as well as the doped connection 18a that serves as a source/drain region within the n MOS transistor, are all connected to Vss as ground. Source/drain regions 18b and 20d are connected together. Doped connections 18c and 18d, and source/drain region 20c are connected in common as Vcc such as to energize the CMOS semiconductor product.

Within the CMOS semiconductor product as illustrated in FIG. 5, no guard ring structures are employed surrounding either of the MOS transistors. In addition, incident to energizing the CMOS semiconductor product as illustrated in accord with FIG. 5, no parasitic transistor is formed between the first MOS transistor and the second MOS transistor since the Vcc voltage is the same at the separated initial doped well 12a" and the further additional doped well 16, with respect to the initial doped well 12b. Since no parasitic transistor is formed the invention allows for a reduction of separation distance of the initial doped well 12b and the separated initial doped well 12a" which in turn provides for a reduced separation distance of the pair of MOS transistors. The specific ordering for forming the doped wells that provide the CMOS semiconductor product of FIG. 5 is not limited to the sequence illustrated in FIGS. 1–4, but rather alternative orderings may also be employed.

EXAMPLES

In order to illustrate the value of the invention, a CMOS semiconductor product was fabricated in accord with FIG. 5. An additional CMOS semiconductor product was also fabricated, but absent the further additional doped well 16.

Figure 6:
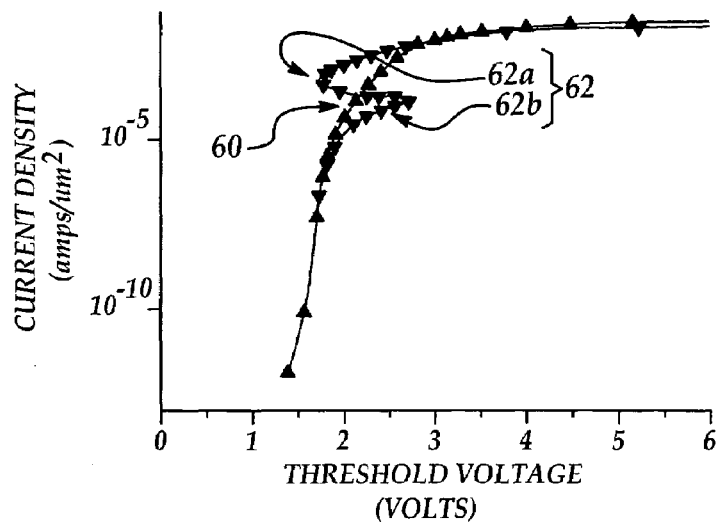
FIG. 6 shows a graph of Current Density versus Threshold Voltage for CMOS semiconductor products fabricated in accord and not in accord with the invention.

Current density versus threshold voltage measurements were obtained for each of the CMOS semiconductor products at a Vdd voltage of 1.0 volts. Results of the measurements are illustrated in the graph of FIG. 6. Within FIG. 6, reference numeral 60 corresponds with electrical data points obtained for the CMOS semiconductor product in accord with the invention. Reference numeral 62 corresponds with electrical data points obtained for the CMOS semiconductor product absent the further additional doped well 16. The data points corresponding with reference numeral 62 illustrate a pair of dislocations 62a and 62b that are indicative of a voltage snap-back phenomenon. The voltage snap-back phenomenon is in turn indicative of CMOS semiconductor product latch-up.

Figure 7:
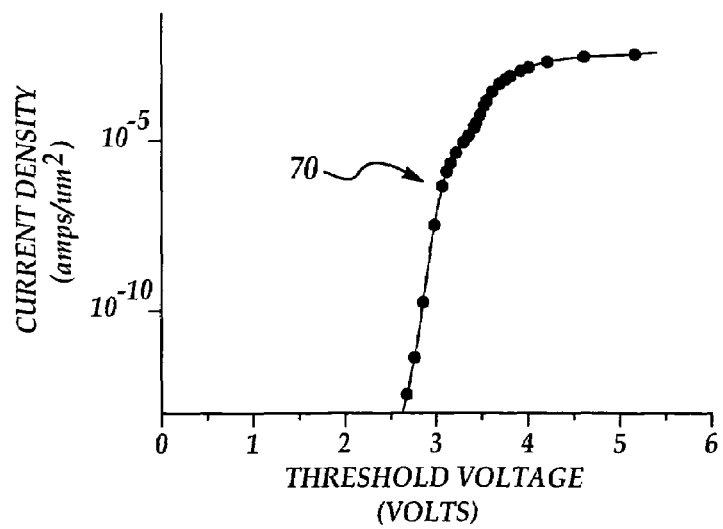
FIG. 7 shows an additional graph of Current Density versus Threshold Voltage for a CMOS semiconductor product fabricated in accord with the invention.

FIG. 7 shows an additional measurement of a CMOS semiconductor product in accord with the invention undertaken at a Vdd of 2.5 volts rather than 1.0 volts. As is illustrated in FIG. 7, even at an increased Vdd of 2.5 volts a CMOS semiconductor product fabricated in accord with the invention does not show a snap-back or latch-up effect.

The preferred embodiment and examples of the invention are illustrative of the invention rather than limiting of the invention. Revisions and modifications may be made to materials, structures and dimensions of a semiconductor product in accord with the preferred embodiment and examples of the invention while still providing a semiconductor product in accord with the invention, further in accord with the accompanying claims.

What is claimed is:

1. A CMOS semiconductor product comprising:
   a semiconductor substrate;
   a first doped well of the first polarity and a laterally separated second doped well of a second polarity opposite the first polarity, both formed into the semiconductor substrate;
   a third doped well of the second polarity laterally and vertically surrounding the first doped well of the first polarity; and
   a metal oxide semiconductor transistor of the second polarity formed upon the first doped well and a metal oxide semiconductor transistor of the first polarity formed upon the second doped well.

2. The CMOS semiconductor product of claim 1 further comprising a fourth doped well of the second polarity laterally adjoining but not vertically beneath the first doped well of the first polarity.

3. The CMOS semiconductor product of claim 1 wherein the third doped well is formed to a distance of from about 1000 to about 10000 angstroms beneath the first doped well.

4. The CMOS semiconductor product of claim 2 wherein the second doped well is separated from the fourth doped well by a separation distance of less than about 15 microns.

5. The CMOS semiconductor product of claim 1 wherein a guard ring is not employed surrounding either metal oxide semiconductor transistor.

6. A CMOS semiconductor product comprising:
   a p semiconductor substrate;
   a p doped well and a laterally separated first n doped well, both formed into the semiconductor substrate;
   a second n doped well laterally and vertically surrounding the p doped well; and
   a p metal oxide semiconductor transistor upon the first n doped well and a p metal oxide semiconductor transistor formed upon the first n doped well.

7. The CMOS semiconductor product of claim 6 further comprising a third n doped well laterally adjoining but not vertically beneath the p doped well.

8. The CMOS semiconductor product of claim 6 wherein the second n doped well is formed to a distance of from about 1000 to about 10000 angstroms beneath the p doped well.

9. The CMOS semiconductor product of claim 7 wherein the first n doped well is separated from the third n doped well by a separation distance of less than about 15 microns.

10. The CMOS semiconductor product of claim 6 wherein a guard ring is not employed surrounding either metal oxide semiconductor transistor.

11. A method for operating a CMOS semiconductor product comprising:
    providing a CMOS semiconductor product comprising:
       a semiconductor substrate;
       a first doped well of the first polarity and a laterally separated second doped well of a second polarity opposite the first polarity, both formed into the semiconductor substrate;
       a third doped well of the second polarity laterally and vertically surrounding the first doped well of the first polarity; and
       a metal oxide semiconductor transistor of the second polarity formed upon the first doped well and a metal oxide semiconductor transistor of the first polarity formed upon the second doped well; and
    electrically energizing each of the metal oxide semiconductor transistors.

12. The method of claim 11 wherein the CMOS semiconductor product further comprises a fourth doped well of the second polarity laterally adjoining but not vertically beneath the first doped well of the first polarity.

13. The method of claim 11 wherein the third doped well is formed to a distance of from about 1000 to about 10000 angstroms beneath the first doped well.

14. The method of claim 11 wherein the second doped well and the third doped well are held at the same voltage when electrically energizing the metal oxide semiconductor transistors.

15. The method of claim 11 wherein a guard ring is not employed surrounding either metal oxide semiconductor transistor.

16. A method of operating a CMOS semiconductor product comprising:
    providing a CMOS semiconductor product comprising:
       a p semiconductor substrate;
       a p doped well and a laterally separated first n doped well, both formed into the semiconductor substrate;
       a second n doped well laterally and vertically surrounding the p doped well; and
       a p metal oxide semiconductor transistor upon the first n doped well and a p metal oxide semiconductor transistor formed upon the first n doped well; and
    electrically energizing each of the metal oxide semiconductor transistors.

17. The method of claim 16 wherein the CMOS semiconductor product further comprises a third n doped well laterally adjoining but not vertically beneath the p doped well.

18. The method of claim 16 wherein the second n doped well is formed to a distance of from about 1000 to about 10000 angstroms beneath the p doped well.

19. The method of claim 16 wherein the first n doped well and the second n doped well are held at the same voltage when electrically energizing the metal oxide semiconductor transistors.

20. The method of claim 16 wherein a guard ring is not employed surrounding either metal oxide semiconductor transistor.

* * * * *